United States Patent [19]
Kuroda et al.

[11] Patent Number: 5,886,518
[45] Date of Patent: Mar. 23, 1999

[54] NICKEL ALLOY MAGNETOSTRICTIVE WIRE AND DISPLACEMENT DETECTION DEVICE USING SAME

[75] Inventors: Kazushi Kuroda, Toyota; Hideo Hayashi, Takatsuki; Kentaro Ogata, Amagasaki, all of Japan

[73] Assignees: Sumitomo Special Metals Co., Ltd., Osaka; Toyota Jidosha Kabushiki Kaisha, Toyota, both of Japan

[21] Appl. No.: 774,370

[22] Filed: Dec. 27, 1996

[30] Foreign Application Priority Data

Jan. 12, 1996 [JP] Japan .................................. 8-003719

[51] Int. Cl.⁶ ...................................................... G01B 7/14
[52] U.S. Cl. ................................ 324/207.13; 324/207.24; 73/290 V
[58] Field of Search .................. 324/207.13, 207.24, 324/207.22, 533; 73/290 V, 314; 148/301; 420/416; 333/148; 365/157

[56] References Cited

U.S. PATENT DOCUMENTS

| | | | |
|---|---|---|---|
| 3,173,131 | 3/1965 | Perucca | 333/148 |
| 5,017,867 | 5/1991 | Dumais et al. | 324/207.13 |
| 5,110,376 | 5/1992 | Kobayashi et al. | 148/301 |
| 5,262,248 | 11/1993 | Ihara et al. | 148/306 |
| 5,274,328 | 12/1993 | Begin et al. | 324/207.13 |

FOREIGN PATENT DOCUMENTS

| | | |
|---|---|---|
| 0 312 063 | 4/1989 | European Pat. Off. . |
| A-61-112923 | 5/1986 | Japan . |
| A-1-96508 | 4/1989 | Japan . |
| A-2-183117 | 7/1990 | Japan . |
| A-3-231117 | 10/1991 | Japan . |
| A-6-58748 | 3/1994 | Japan . |

OTHER PUBLICATIONS

Richard M. Bozorth, "Ferromagnetism" (D. Van Nostrand Co, Princeton, N.J. Jan. 1951), pp. 112–125.

*Primary Examiner*—Jay M. Patidar
*Attorney, Agent, or Firm*—Oliff & Berridge, PLC

[57] ABSTRACT

A displacement detection device and a wire therefor in which the drawbacks of the conventional Elinvar-type alloy are eliminated, the magnetostriction intensity as well as the magnetostriction propagation speed does not vary with temperature, and a magnetostriction coefficient is sufficiently great to enable an amplification at a high speed of response to be unnecessary. A magnetostrictive wire used in a displacement detection device together with a magnetostriction-generating magnet disposed close thereto and movable relative thereto, said wire substantially composed of 35 to 60 wt % Ni and the balance consisting of Fe and unavoidable impurities, cold-wire-drawn and then heat-treated and having a magnetostriction coefficient greater than that exhibited in an as-cold-wire-drawn state. A displacement detection device includes the above-mentioned magnetostrictive wire and a magnetostrictive-generating magnet disposed movable relative thereto and therealong for detecting a relative displacement between the magnetostrictive wire and the magnet based on a time of propagation, through the wire, of a magnetostriction signal generated in the wire in the portion close to the magnet by a pulse current applied to the wire.

6 Claims, 4 Drawing Sheets

NICKEL ALLOY MAGNETOSTRICTIVE WIRE AND DISPLACEMENT DETECTION DEVICE USING SAME

BACKGROUND OF THE INVENTION

1. Field of the Invention

The present invention relates to a displacement detection device for detecting physical displacement of an object or a liquid level utilizing the magnetostriction phenomenon and to a magnetostrictive wire therefor.

2. Description of the Related Art

U.S. Pat. No. 3,173,131 discloses a magnetostrictive apparatus for displacement detection comprising a magnetostrictive wire, a permanent magnet movable along the wire, an oscillator means for applying a pulse current to the wire, and a receiver means disposed at a selected portion of the wire for receiving an ultrasonic wave or a magnetostriction signal generated in the wire in a portion close to the permanent magnet.

A pulse current applied by the oscillator means to the wire generates a circumferential magnetic field around the wire over the entire length thereof and the permanent magnet also generates an axial magnetic field along the wire only in the portion close thereto, so that the wire in that portion is twisted or distorted through the Wiedemann effect and the sudden occurrence of the distortion forms a twisting vibration or an ultrasonic wave which propagates toward both ends of the wire. Detection of this ultrasonic wave by a receiver means allows a distance L along the wire from the receiver means to the permanent magnet to be given as a function of time t as expressed by:

$$L = V \cdot t$$

where V represents a propagation speed of the ultrasonic wave and is given by the shear modulus G of the magnetostrictive wire and the density $\rho$ of the wire as expressed by:

$$V = (G/\rho)^{1/2}.$$

When a wire is made of Ni, a material commonly used for the wire, the shear modulus G and the density $\rho$ vary with the temperature change, which causes the propagation speed to vary and an error in the distance measurement to occur.

Japanese Unexamined Patent Publication No. 2-183117 discloses a magnetostrictive wire made of an Elinvar alloy such as "NiSpanC" (trade name), which is a constant-modulus alloy having a modulus which does not vary with temperature. The temperature coefficient of the ultrasonic wave propagation speed of the Elinvar alloy can be reduced to 20 ppm/°C. or less by heat treatment or other processing conditions. In contrast, the measurement error due to temperature change in the detection circuitry generally ranges from 200 to 500 ppm/°C. Therefore, the variation of the ultrasonic wave propagation speed of the Elinvar alloy can practically be ignored. Thus, the Elinvar alloy is advantageously used as a material of magnetostrictive wire because of its small temperature coefficient of the resonance frequency and a stable magnetostriction transfer speed or twisting vibration speed which does not vary with temperature.

On the other hand, the Elinvar alloy has a magnetostrictive coefficient ($\lambda$) as small as about $5 \times 10^{-6}$, and therefore, the displacement detection requires amplification at a high speed of response. Moreover, the magnetostrictive coefficient is slightly reduced at temperatures above 100° C., which also causes an error in the displacement detection.

SUMMARY OF THE INVENTION

The object of the present invention is to provide a magnetostrictive wire which overcomes the drawbacks of the conventional Elinvar alloy wire so that not only the magnetostriction transfer speed but also the magnetostriction intensity do not vary with temperature and the magnetostriction coefficient is sufficiently great so that the displacement detection can be effected without the necessity of amplification at a high speed of response.

To achieve the above object according to the present invention, there is provided a magnetostrictive wire for a displacement detection device together with a magnetostriction-generating magnet disposed close thereto and movable relative thereto, the wire substantially composed of 35 to 60 wt % Ni and the balance consisting of Fe and unavoidable impurities, cold-wire-drawn and then heat-treated and having a magnetostriction coefficient greater than that exhibited in an as-cold-wire-drawn state. The heat treatment is preferably carried out at a temperature of from 400° C. to 1100° C.

There is also provided a displacement detection device comprising a magnetostrictive wire and a magnetostriction-generating magnet disposed movable relative thereto and therealong for detecting a relative displacement between the magnetostrictive wire and the magnet based on a time of propagation, through the wire, of a magnetostriction signal generated in the wire in the portion close to the magnet by a pulse current applied to the wire, said wire being substantially composed of 35 to 60 wt % Ni and the balance consisting of Fe and unavoidable impurities, cold-wire-drawn and then heat-treated and having a magnetostriction coefficient greater than that exhibited in an as-cold-wire-drawn state.

The magnetostrictive wire according to the present invention is substantially composed of 35 to 60 wt % Ni and the balance consisting of Fe and unavoidable impurities. Namely, the present inventive alloy is based on a Permaloy-type alloy composed of 35 to 60 wt % Ni and the balance of Fe. It is conventionally well known that Permaloy-type alloys having compositions within that range have a large magnetostriction coefficient.

Commercially available Permaloy-type alloys include a high Ni group including grade A (70 to 80 wt % Ni) and grade C (70 to 80 Ni, with 4 to 14 wt % of one or two of Cu, Mo, Cr, and Nb) and a low Ni group including grade B (40 to 50 wt % Ni or 40 to 50 wt % Ni with 3 to 5 wt % one of Mo, Si, and Cu), grade D (35 to 40 wt % Ni) and grade E (45 to 55 wt % Ni). According to the present invention, the magnetostrictive wire is made of an alloy based on the Permaloy-type alloy of the low Ni group or grades B, D and E. The magnetostrictive wire of the present invention is typically made of an alloy composed of 50 wt % Ni and 50 wt % Fe.

The magnetostrictive wire of the present invention may contain Mo, Si, and Cu, which are contained in some B grade Permaloy-type alloy, and may also contain a few wt % of other additives for improving permeability or corrosion resistance.

The Elinvar-type alloys used for magnetostrictive wires include classes I, II, III, and IV, in which classes II, III, and IV do not contain Ni as a primary component, i.e., contain another element in an amount more than that of Ni, if Ni is contained. Class I purposely contains Cr as an additive to stabilize or render the temperature-caused variation of the shear modulus to be zero in the as-produced condition, although it contains Ni as a primary component, as typically exemplified by 36 wt % Ni-12 wt % Cr-Fe, which is called Elinvar. Some of the class I alloys further contain 0.5 to several wt % C, Ti, Mo, Si, Mn, Al, etc.

The alloy magnetostrictive wire of the present invention does not necessarily contain Cr as a purposed additive and the Cr content is preferably not more than 1 wt %, more preferably not more than 0.5 wt %. This is to ensure a magnetostriction coefficient greater than that of the Elinvar-type alloy purposely containing Cr.

The present inventive magnetostrictive wire is produced from the above-mentioned alloy by cold-wire-drawing and then heat-treating. The heat treatment provides a magnetostriction coefficient greater than that exhibited in the as-cold-wire-drawn state. According to the present invention, the magnetostriction coefficient does not substantially depend on the reduction of area in the cold wire drawing. The magnetostriction coefficient is increased by heat treatment after cold wire drawing in comparison with that obtained after cold wire drawing. Usually the heat treatment is carried out in a furnace but is not necessarily limited in the furnace. The heat treatment atmosphere is not necessarily limited, but may be any atmosphere which does not have substantial influence on the surface quality, chemical composition, magnetostrictive property, etc. of the wire at a heat treatment temperature used. The atmosphere may be selected from an oxidizing atmosphere such as air and oxygen, a reducing atmosphere such as hydrogen, and an inert gas atmosphere such as argon, in accordance with the existing heat treatment equipment. For example, an oxidizing atmosphere does not have a substantial influence of the magnetostrictive property, even if a thin oxide film is formed on the wire surface.

In the Permaloy-type alloy used for the magnetostrictive wire according to the present invention, the magnetostriction coefficient is not reduced even at elevated temperatures of higher than 100° C. as was encountered with the conventional Elinvar-type alloy wire, but both the magnetostriction coefficient and the magnetostriction transfer speed do not substantially vary over a wide temperature range of from −40° C. to 150° C.

In a preferred embodiment of the present invention, the heat treatment is carried out at a temperature of from 400° C. to 1100° C.

To carry out the heat treatment, it should be considered that the suitable temperature of the furnace atmosphere for achieving a desired magnetostriction coefficient varies with the heat treatment method. Typically, substantially the same value of the magnetostriction coefficient is obtained either by holding in a batch furnace held at 800° C. for 2 hours or by passing through a continuous furnace held at 920° C., at a transfer speed of 45 m/min, in 6 seconds.

DESCRIPTION OF THE PREFERRED EMBODIMENTS

Figure 1:
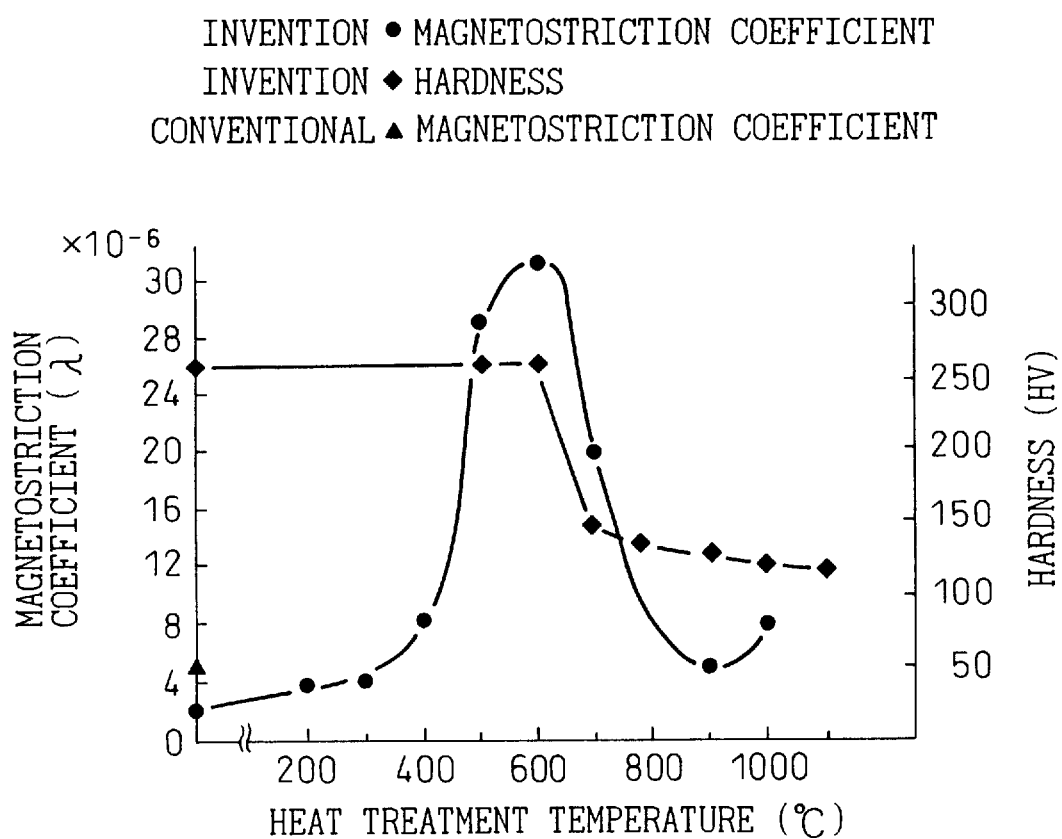
FIG. 1 is a graph showing the magnetostriction coefficient and the hardness of the magnetostrictive wire as a function of the heat treatment temperature, according to the present invention.

FIG. 1 shows the magnetostriction coefficient and the hardness as a function of the heat treatment temperature for a 50 wt % Ni-Fe alloy wire (0.4 mm φ dia.) as a typical example of the magnetostrictive wire according to the present invention. For comparison, FIG. 1 also contains a plot which represents the magnetostriction coefficient of a NiSpanC alloy wire, which is a conventional Elinvar-type alloy wire.

As shown in FIG. 1 at the left end, the conventional Elinvar-type wire, which is not heat-treated but is used in an as-cold-wire-drawn state, has a magnetostriction coefficient of about $5 \times 10^{-6}$.

The present inventive wire in an as-cold-wire-drawn state has a coefficient of $2 \times 10^{-6}$, which is smaller than that of the conventional Elinvar-type wire, but has a coefficient greater than that of the conventional wire after being heat-treated. The heat treatment, particularly when carried out at a temperature of from 400° C. to 1100° C., provides a remarkably improved magnetostriction coefficient. A heat treatment at about 600° C. yields a greatest coefficient eight times greater than that of the conventional wire.

It should be also noted that the present inventive wire exhibits two different levels of hardness when heat-treated at temperatures lower than and higher than 600° C.

Figure 2:
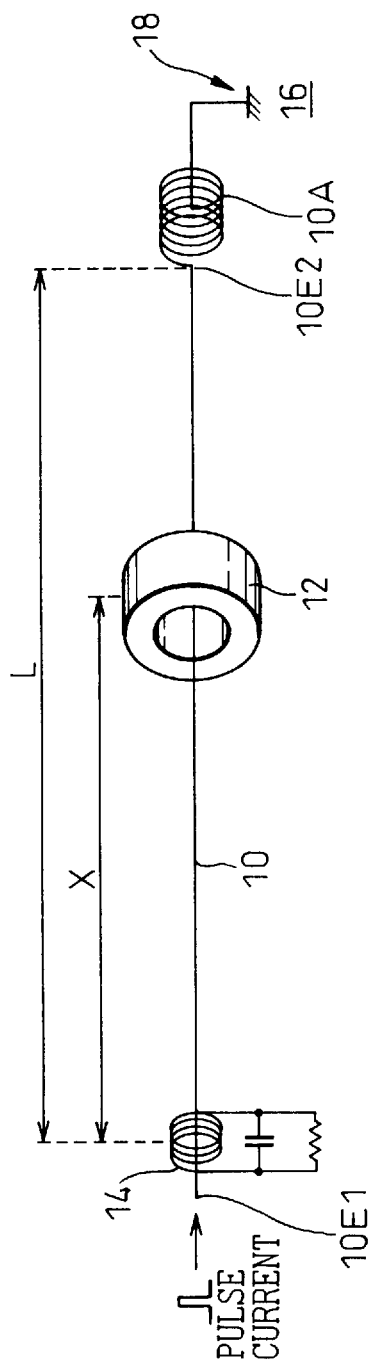
FIG. 2 schematically illustrates a spring-integrated magnetostrictive wire having a high level of hardness, according to the present invention.

When heat-treated at a temperature of from 400° C. to 600° C., the wire of the present invention has the same level of hardness (about HV260) as in the as-cold-wire-drawn state. FIG. 2 schematically illustrates a preferred embodiment of a displacement detection device according to the present invention utilizing the high level of hardness.

A magnetostrictive wire 10 has one end 10A in the form of a coil spring having a tip fixed to a support member 16. The linear main body of the wire 10 extends through a ring-shaped magnetostriction-generating permanent magnet 12 which travels along, and relative to, the wire 10. The wire 10 has the other end surrounded by a detection coil 14 disposed at a distance L (the substantial length of the linear main body of the wire 10) from the coil spring 10A and at a distance X from the permanent magnet 12. Pulse currents are applied to the wire 10 through the end at which the detection coil 14 is disposed.

In a displacement detection device using a magnetostriction wire, a constant tension must be applied to the wire in order to ensure a uniform amount of magnetostriction over the entire length of the wire. To this end, a spring is conventionally connected to one end of the wire by caulking or another method. In contrast, a magnetostriction wire having a high level of hardness according to the present invention can have one end 10A formed as a coil spring as shown in FIG. 2, i.e., the main body 10 and the coil spring 10A can be integrated. This is advantageous over the conventional wire because, unlike the conventional caulked spring, the integrally formed coil spring 10A is not disconnected from the body 10 thereby improving the reliability and because the number of the component members is reduced to enable the production cost to be reduced.

Figure 3:
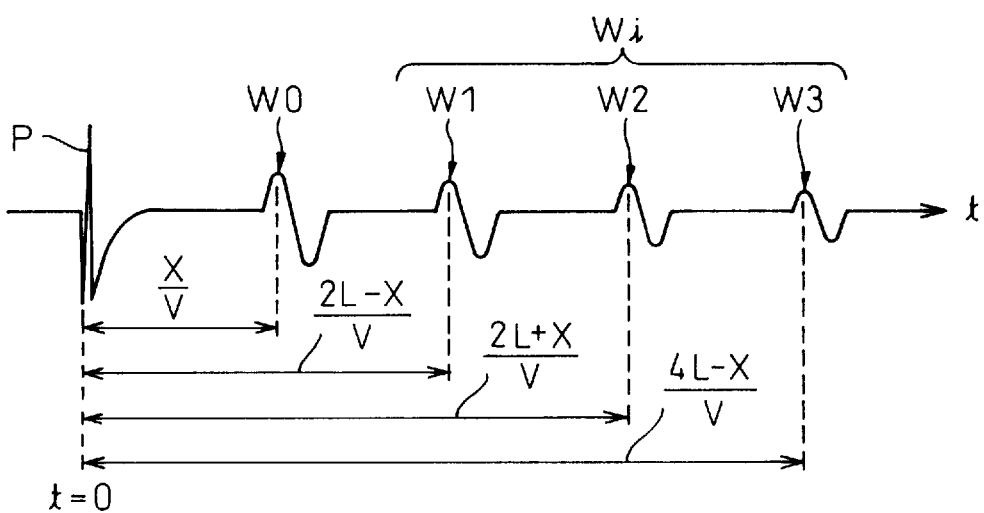
FIG. 3 is a graph showing reflection waves from one end of a magnetostrictive wire.

When heat-treated at a temperature of from 600° C. to 1100° C., the wire has a lower level of hardness (about HV120 to 140). Referring to FIGS. 3 and 4, a preferred embodiment of a displacement detection device according to the present invention utilizing the lower level of hardness will be described. In this case, a displacement detection device has substantially the same structure as that shown in FIG. 2, except that the magnetostrictive wire 10 is not integral with the spring 10A but a separate spring is connected to one end of the wire.

As shown in FIG. 3, an initial magnetostriction W0 is generated in the wire in the portion close to the magnet 12 at the time (t=0) of application of a current pulse P and is reflected by both ends 10E1 and 10E2 of the wire or a joint 18 of the wire 10 and the support member 16 to form reflected waves Wi, which propagates through the wire while being weakened.

For simplicity, FIG. 3 shows the respective times at which magnetostriction signals reach the detection coil 14, only taking the initial signal and the reflected signals from both ends 10E1 and 10E2 (FIG. 2) of the wire into consideration. The time at which a reflected wave reaches the detection coil 14 is determined as a function of the distance X to the magnet and the distance L to the spring 10A from the detection coil 14 and the propagation speed V of the reflected waves.

Referring to FIG. 3, an initial magnetostriction W0 generated in the wire 10 at the position of the magnet 12 propagates leftward, on one hand, through the wire 10 over a distance X to reach the position of the detection coil 14 at a time t=X/V, and is detected as a signal representing the position of the magnet 12.

On the other hand, the initial signal W0 also propagates rightward through the wire 10 over a distance L-X and is reflected by the right end 10E2 of the wire 10 to form a reflected signal W1, which then propagates leftward through the wire 10 over a distance L and reaches the position of the detection coil 14 at a time (2L−X)/V.

The initial signal W0 is also reflected by the left end 10E1 of the wire 10, on which the detection coil 14 is disposed, to form a reflected signal W2, which goes and back over the entire length L of the wire 10, i.e., propagates over a length 2L, and returns to the position of the detection coil 14. Considering the initial propagation distance X, the arrival time is t=(2L+X)/V.

Another reflected wave W3 shown in FIG. 3 is formed from the first reflected wave W1 when the latter is twice reflected by the left end 10E1 and the right end 10E2 and reaches the position of the detection coil 14.

Figure 4A:
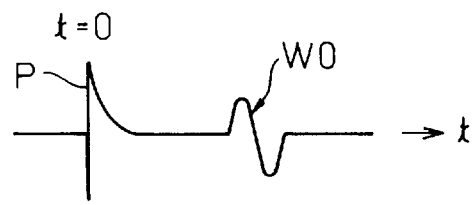
FIGS. 4(a) and 4(b) are graphs showing magnetostriction waves before and after being deformed by the reflection waves shown in FIG. 3.
Figure 4B:
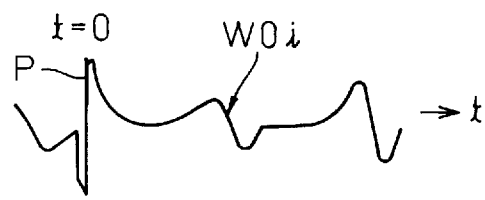

In the presence of different reflected waves Wi as described above, if the time resolution is increased by reducing the current pulse interval to improve the detection response, the initial signal W0 (FIG. 4(a)) is influenced by the reflected wave W1 (FIG. 3) to be a deformed wave W0I (FIG. 4(b)), so that an error occurs in the detected position.

To solve this problem, it was conventionally necessary that a resilient member be connected to one end of a magnetostrictive wire to minimize or avoid reflection of the magnetostriction signals, as disclosed in Japanese Unexamined Patent Publication No. 61-112923.

The magnetostrictive wire having the lower level of hardness according to the present invention provides a reduced amplitude of the reflected waves because of its low reflection efficiency. This advantageously reduces the wave reflection at the wire ends without using a resilient member which was conventionally necessary, so that the time resolution can be increased by reducing the current pulse interval to improve the detection response.

In order to further reduce the reflection, the end portion of the magnetostrictive wire may be coated with a vibration absorbing material such as silicone resin.

Figure 5:
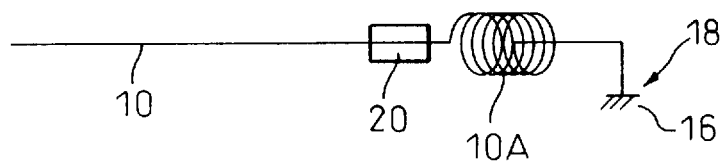
FIG. 5 schematically illustrates a spring-integrated magnetostrictive wire shown in FIG. 2, in which the wire is coated with a vibration absorbing material such as silicone resin, according to the present invention.

If such a wire having the higher level of hardness is coated with a vibration reducing material, a wire integral with a spring is obtained because of the high hardness and the reflection is also reduced. FIG. 5 shows a spring-integrated wire having a high hardness, as shown in FIG. 2, having a portion close to the spring 10A, the portion being coated with silicone resin 20.

The magnetostrictive wire of the present invention has either a high hardness or a low hardness which can be selectively utilized in accordance with application of the displacement detection device, and also has both advantages of the high hardness and the reflection reduction effect as shown in FIG. 5.

As described herein, the present invention provides a displacement detection device and a wire therefor in which the drawbacks of the conventional Elinvar-type alloy is eliminated, the magnetostriction intensity as well as the magnetostriction propagation speed does not vary with temperature, and a magnetostriction coefficient is sufficiently great to enable an amplification at a high speed of response to be unnecessary.

We claim:

1. A magnetostrictive wire used in a displacement detection device together with a magnetostriction-generating magnet disposed close thereto and movable relative thereto, said wire substantially composed of 35 to 60 wt % Ni and the balance consisting of Fe and unavoidable impurities, cold-wire-drawn and then heat-treated and having a magnetostriction coefficient greater than that exhibited in an as-cold-wire-drawn state.

2. A magnetostrictive wire according to claim 1, wherein said heat treatment is carried out at a temperature of from 400° C. to 1100° C.

3. The magnetostrictive wire according to claim 1, wherein the wire is 50 wt % Ni and 50 wt % Fe.

4. The magnetostrictive wire according to claim 1, wherein the wire has a magnetostriction coefficient of $2 \times 10^{-6}$.

5. The magnetostrictive wire according to claim 1, wherein the heat treatment is performed about 600° C.

6. A displacement detection device comprising a magnetostrictive wire and a magnetostrictive-generating magnet disposed movable relative thereto and therealong for detecting a relative displacement between the magnetostrictive wire and the magnet based on a time of propagation, through the wire, of a magnetostriction signal generated in the wire in the portion close to the magnet by a pulse current applied to the wire, said wire being substantially composed of 35 to 60 wt % Ni and the balance consisting of Fe and unavoidable impurities, cold-wire-drawn and then heat-treated and having a magnetostriction coefficient greater than that exhibited in an as-cold-wire-drawn state.

* * * * *